(12) United States Patent
Chen et al.

(10) Patent No.: US 10,867,943 B2
(45) Date of Patent: Dec. 15, 2020

(54) DIE STRUCTURE, DIE STACK STRUCTURE AND METHOD OF FABRICATING THE SAME

(71) Applicant: Taiwan Semiconductor Manufacturing Co., Ltd., Hsinchu (TW)

(72) Inventors: Yi-Hsiu Chen, Hsinchu (TW); Tsang-Jiuh Wu, Hsinchu (TW); Wen-Chih Chiou, Miaoli County (TW); Tung-Hsien Wu, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/009,221

(22) Filed: Jun. 15, 2018

(65) Prior Publication Data
US 2019/0385963 A1 Dec. 19, 2019

(51) Int. Cl.
*H01L 23/00* (2006.01)
*H01L 25/065* (2006.01)

(52) U.S. Cl.
CPC .............. *H01L 24/05* (2013.01); *H01L 24/03* (2013.01); *H01L 24/08* (2013.01); *H01L 25/0657* (2013.01); *H01L 24/89* (2013.01); *H01L 2224/0311* (2013.01); *H01L 2224/0345* (2013.01); *H01L 2224/03616* (2013.01); *H01L 2224/03827* (2013.01); *H01L 2224/03845* (2013.01); *H01L 2224/05015* (2013.01); *H01L 2224/05017* (2013.01); *H01L 2224/05083* (2013.01); *H01L 2224/05555* (2013.01); *H01L 2224/05557* (2013.01);
(Continued)

(58) Field of Classification Search
CPC ......... H01L 24/03; H01L 24/05; H01L 24/08; H01L 24/98; H01L 25/0657; H01L 2224/0555; H01L 2224/05573; H01L 2224/05083; H01L 2224/05017; H01L 2224/05557; H01L 2224/0311; H01L 2224/03845; H01L 2224/08145; H01L 2224/0345; H01L 2224/03827; H01L 2224/80895; H01L 2224/03616; H01L 2224/06565; H01L 2224/05015
USPC .................................................. 438/618, 622
See application file for complete search history.

(56) References Cited

U.S. PATENT DOCUMENTS 6,097,096 A * 8/2000 Gardner ............ H01L 21/76801
257/777
6,624,066 B2 * 9/2003 Lu .................... H01L 21/76807
257/E21.579

(Continued)

*Primary Examiner* — Dale E Page
*Assistant Examiner* — Quovaunda Jefferson
(74) *Attorney, Agent, or Firm* — JCIPRNET

(57) ABSTRACT

Provided is a die structure including a die, a bonding structure, and a protection structure. The die includes a substrate and a metal feature disposed over the substrate. The bonding structure is disposed over the die. The bonding structure includes a bonding dielectric layer and a bonding metal layer disposed in the bonding dielectric layer. The bonding metal layer is electrically connected to the metal feature of the die. The protection structure is disposed between a top portion of the bonding metal layer and a top portion of the bonding dielectric layer. A die stack structure and a method of fabricating the die structure are also provided.

20 Claims, 8 Drawing Sheets

(52) U.S. Cl.
CPC ............ *H01L 2224/05573* (2013.01); *H01L 2224/08145* (2013.01); *H01L 2224/80895* (2013.01); *H01L 2224/80896* (2013.01); *H01L 2225/06565* (2013.01)

(56) References Cited

U.S. PATENT DOCUMENTS

| | | | |
|---|---|---|---|
| 7,232,708 B2 * | 6/2007 | Morkner | H01L 25/18 257/E25.013 |
| 7,348,672 B2 * | 3/2008 | Chen | H01L 21/76834 257/758 |
| 7,955,971 B2 * | 6/2011 | Yang | H01L 21/76846 257/751 |
| 8,664,763 B2 * | 3/2014 | Kagawa | H01L 24/94 257/758 |
| 8,993,380 B2 | 3/2015 | Hou et al. | |
| 9,281,254 B2 | 3/2016 | Yu et al. | |
| 9,287,251 B2 * | 3/2016 | Kang | H01L 24/03 |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2002/0146899 A1 * | 10/2002 | Chun | H01L 21/76831 438/618 |
| 2012/0094469 A1 * | 4/2012 | Landru | H01L 24/05 438/455 |

* cited by examiner

DIE STRUCTURE, DIE STACK STRUCTURE AND METHOD OF FABRICATING THE SAME

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Exemplary types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. In 3DICs, active circuits such as logic, memory, processor circuits, and the like are fabricated over different semiconductor wafers. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
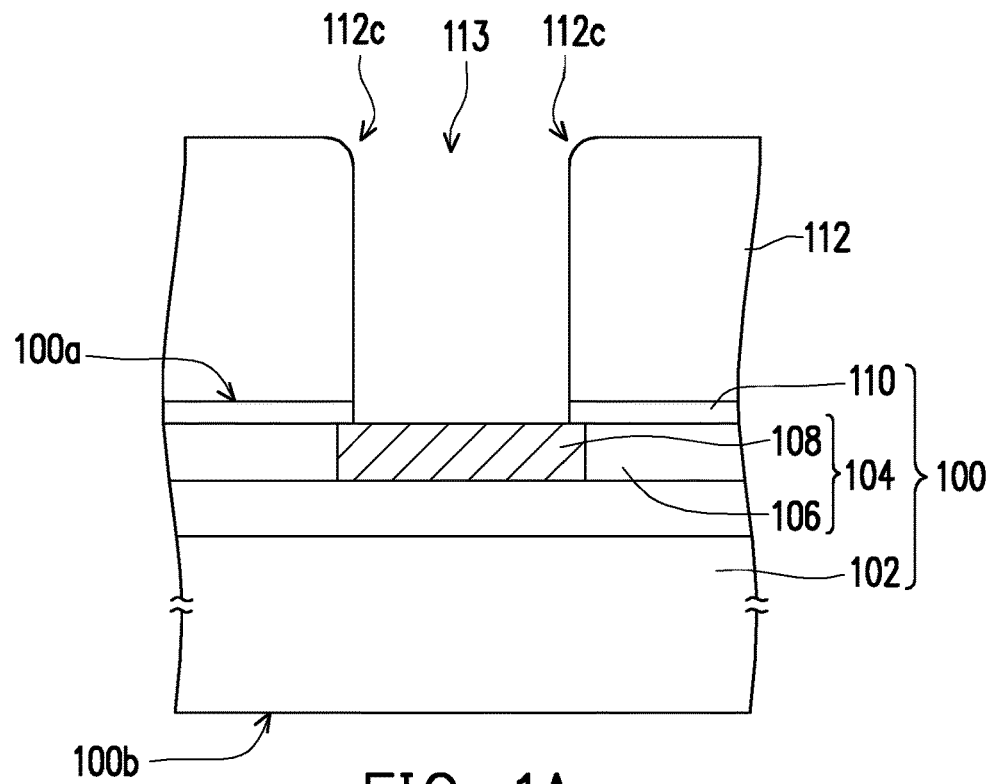
FIG. 1A to FIG. 1G are cross-sectional views of a method of forming a die stack structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views of a method of forming a die stack structure in accordance with a first embodiment. Additional steps can be provided before, during, and after the method illustrated in FIG. 1A to FIG. 1G, and some of the steps described can be replaced or eliminated for other embodiments of the method.

Referring to FIG. 1A, a first die 100 is provided. In some embodiments, the first die 100 includes a front side 100a and a back side 100b opposite to each other. The front side 100a of the first die 100 faces upward. In some embodiments, the front side 100a of the first die 100 is an active surface. Although the first die 100 illustrated in FIG. 1A is only one die, the embodiments of the present invention are not limited thereto. In other embodiments, the first die 100 is illustrated as one of a plurality of dies of the whole wafer. In detail, the first die 100 includes a first substrate 102, a first interconnect structure 104, and a first passivation layer 110.

In some embodiments, the first substrate 102 may include silicon or other semiconductor materials. Alternatively, or additionally, the first substrate 102 may include other elementary semiconductor materials such as germanium. In some embodiments, the first substrate 102 is made of a compound semiconductor such as silicon carbide, gallium arsenic, indium arsenide or indium phosphide. In some embodiments, the first substrate 102 is made of an alloy semiconductor such as silicon germanium, silicon germanium carbide, gallium arsenic phosphide, or gallium indium phosphide. In some embodiments, the first substrate 102 includes an epitaxial layer. For example, the first substrate 102 has an epitaxial layer overlying a bulk semiconductor. In other embodiments, the first substrate 102 includes a semiconductor-on-insulator (SOI) substrate.

As shown in FIG. 1A, the first interconnect structure 104 is formed over the first substrate 102. In detail, the first interconnect structure 104 includes a first insulating material 106 and a first metal feature 108. The first metal feature 108 is formed in the first insulating material 106. The first metal feature 108 is illustrated as one conductive line in FIG. 1A, however, the embodiments of the present invention are not limited thereto. In alternative embodiments, the first metal feature 108 includes a plurality of plugs and a plurality of conductive lines. One of the plugs may be electrically connected to one or more conductive lines. As shown in FIG. 1A, a portion of the first metal feature 108, such as top metal feature, is exposed by the first insulating material 106. Hereafter, the first metal feature 108 is referred as the top metal feature 108. In some embodiments, the first insulating material 106 includes silicon oxide, silicon oxynitride, silicon nitride, low dielectric constant (low-k) materials or a combination thereof. In some alternative embodiments, the first insulating material 106 may be a single layer or multiple layers. The first metal feature 108 may be made of tungsten (W), copper (Cu), copper alloys, aluminum (Al), aluminum alloys, or a combination thereof.

In some embodiments, some device regions (not shown) are formed over the first substrate 102 in a front-end-of-line (FEOL) process. That is, the device regions may be formed between the first substrate 102 and the first interconnect structure 104. In other embodiments, the device regions are electrically connected to the first metal feature 108. One of the device regions includes a wide variety of integrated circuit devices (not shown) formed over the first substrate 102. In some embodiments, the integrated circuit devices may include active devices (e.g., diodes, transistors, opto-electronic devices, or like), passive devices (e.g., resistors, capacitors, inductors, or like).

Referring to FIG. 1A, the first passivation layer 110 is formed over the first interconnect structure 104. The first passivation layer 110 covers the first insulating material 106 and a portion of the top metal feature 108. In other words, the portion of the top metal feature 108 is covered by the first passivation layer 110, and another portion of the top metal features 108a is exposed by the first passivation layer 110. In some embodiments, the first passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like.

Referring to FIG. 1A, a first bonding dielectric material 112 having opening 113 therein is formed over the front side 100a of the first die 100. In detail, a bonding dielectric material (not shown) is formed to cover the top metal feature 108 and first passivation layer 110 by a suitable deposition process, such as PECVD, HDPCVD, etc. The bonding dielectric material is patterned by lithography and etching processes to form the opening 113 in the first bonding dielectric material 112. The opening 113 is corresponding to the top metal feature 108. During the etching process, the top metal feature 108 serves as an etching stop layer, and thus the top metal feature 108 is exposed by the opening 113. In some embodiments, the first bonding dielectric material 112 includes silicon oxide, silicon nitride, silicon oxynitride, silicon carbide or a combination thereof. In some embodiments, the material of the first bonding dielectric material 112 is different from the material of the first passivation layer 110.

Figure 1B:
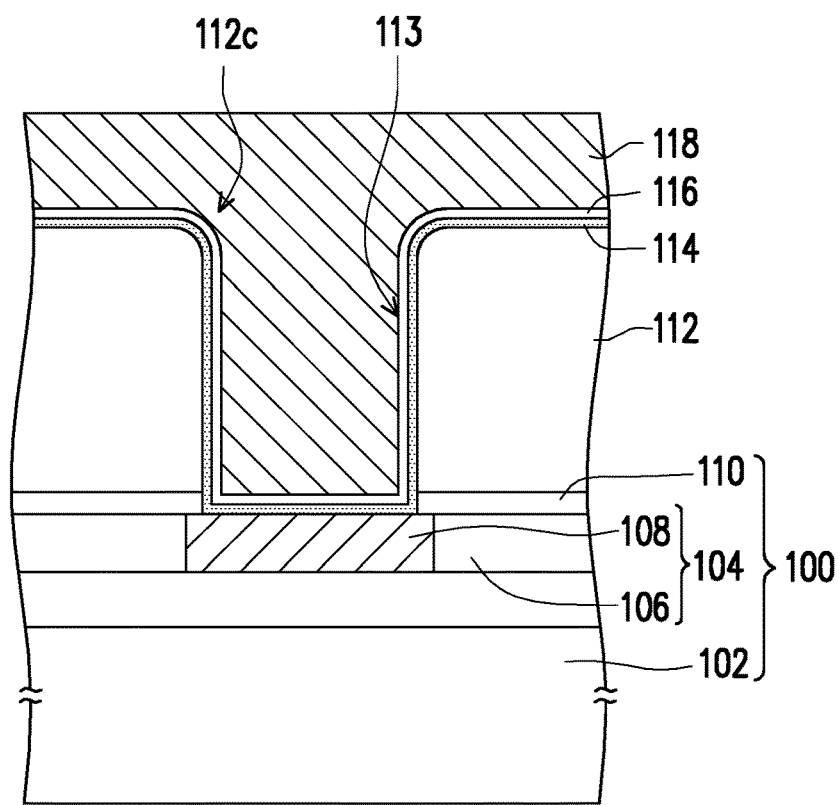
Figure 1F:
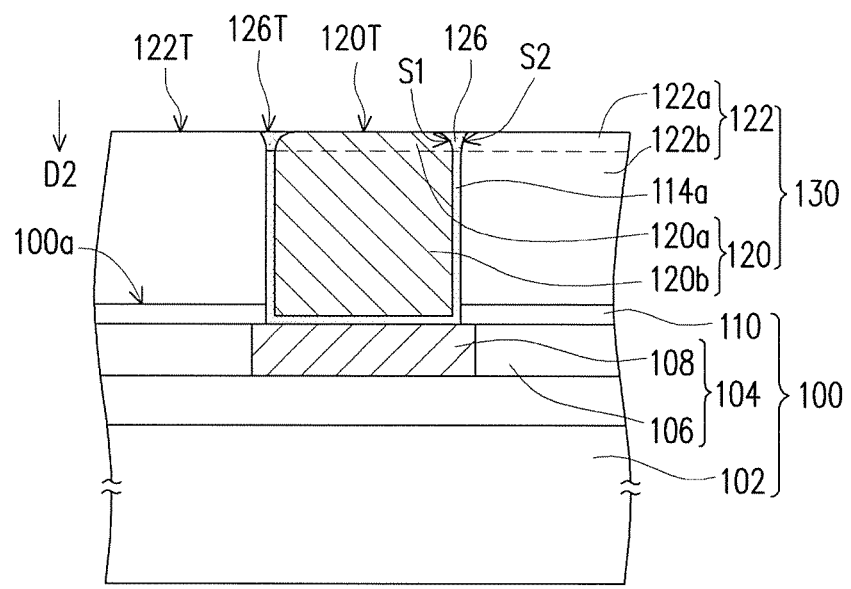
Figure 2:
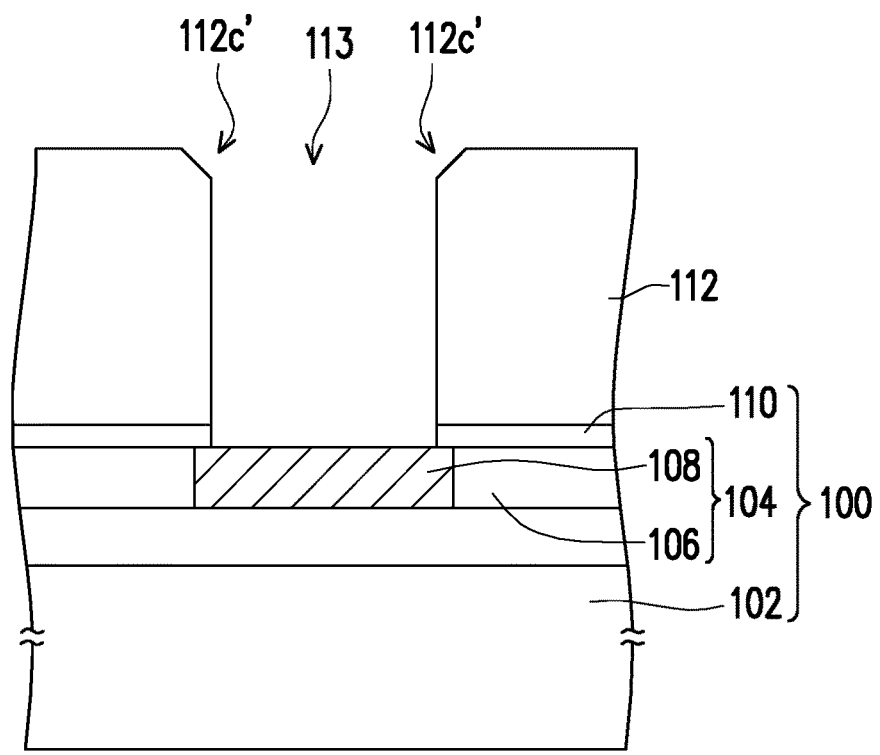
FIG. 2 is a cross-sectional view of a structure of FIG. 1A in accordance with some embodiments.

In some embodiments, the opening 113 is formed by a dry etching process, such as a reactive ion etching (RIE) process. The RIE process may use a reactive ion gas enhanced by the plasma to bombard the bonding dielectric material formed over the first die 100, to achieve the purpose of the etching. It should be noted that the first bonding dielectric material 112 has a corner 112c after the ion bombardment of the dry etching process. The corner 112c of the first bonding dielectric material 112 is curved or rounding, so that to-be-formed first conductive material 118 (as shown in FIG. 1B) is ease to fill in the opening 113. Therefore, the rounding corner 112c of the first bonding dielectric material 112 is able to provide a space and/or a recess to accommodate to-be-formed first protection structure 126 (as shown in FIG. 1F). Although the corner 112c of the first bonding dielectric material 112 are curved or rounding, the embodiments of the present invention are not limited thereto. In other embodiments, the corner 112c' of the first bonding dielectric material 112 may be straight or planar, as shown in FIG. 2.

Referring to FIG. 1B, after the opening 113 is formed in the first bonding dielectric material 112, a first barrier layer 114, a first seed layer 116, and a first conductive material 118 are formed in order over the first bonding dielectric material 112. In detail, the first barrier layer 114 is conformally formed over a bottom surface and sidewalls of the opening 113 and a top surface of the first bonding dielectric material 112. From another perspective, the first barrier layer 114 covers and contacts with a top surface of the portion of the top metal feature 108 and extends from sidewalls of the first passivation layer 110 and the first bonding dielectric material 112 to cover the top surface of the first bonding dielectric material 112. In some embodiments, the first barrier layer 114 includes $Ta_2O_5$, Ta, TaN, Ti, TiN, CoW or a combination thereof, and is formed by a suitable process such as PVD, CVD, ALD or the like. In an embodiment, a thickness of the first barrier layer 114 is about 50 Å to 2 KÅ. The first barrier layer 114 is able to prevent the first conductive material 118 from diffusing into the first bonding dielectric material 112.

The first seed layer 116 is conformally formed over the first barrier layer 114. In some embodiments, the first seed layer 116 is a metal layer, which may be a single layer or a composite layer including a plurality of sub-layers formed of different materials. In some embodiments, the first seed layer 116 is, for example, a titanium/copper composited layer, wherein the sputtered titanium thin film is in contact the first barrier layer 114, and the sputtered copper thin film is then formed over the sputtered titanium thin film. In some alternative embodiments, the first seed layer 116 may be other suitable composited layer such as metal, alloy, barrier metal, or a combination thereof. In an embodiment, a thickness of the first seed layer 116 is about 500 Å to 4 KÅ. In some embodiments, the first barrier layer 114 and the first seed layer 116 include different materials.

The first conductive material 118 is formed and filled in the openings 10. The first seed layer 116 is disposed between the first conductive material 118 and the first barrier layer 114. In some embodiments, the first conductive material 118 is filled up the openings 10 and extended to cover the top surface of the first bonding dielectric material 112, as shown in FIG. 1B. From another perspective, the first conductive material 118 in the opening 113 is surrounded by the first seed layer 116. In some embodiments, the first conductive material 118 includes metal material, such as aluminum, copper, nickel, gold, silver, tungsten, or a combination thereof and formed by electro-chemical plating process, CVD, PVD or the like. In some embodiments, the first conductive material 118 and the first seed layer 116 may include the same material. In some alternative embodiments, the first conductive material 118 and the first seed layer 116 may include different materials.

Figure 1C:
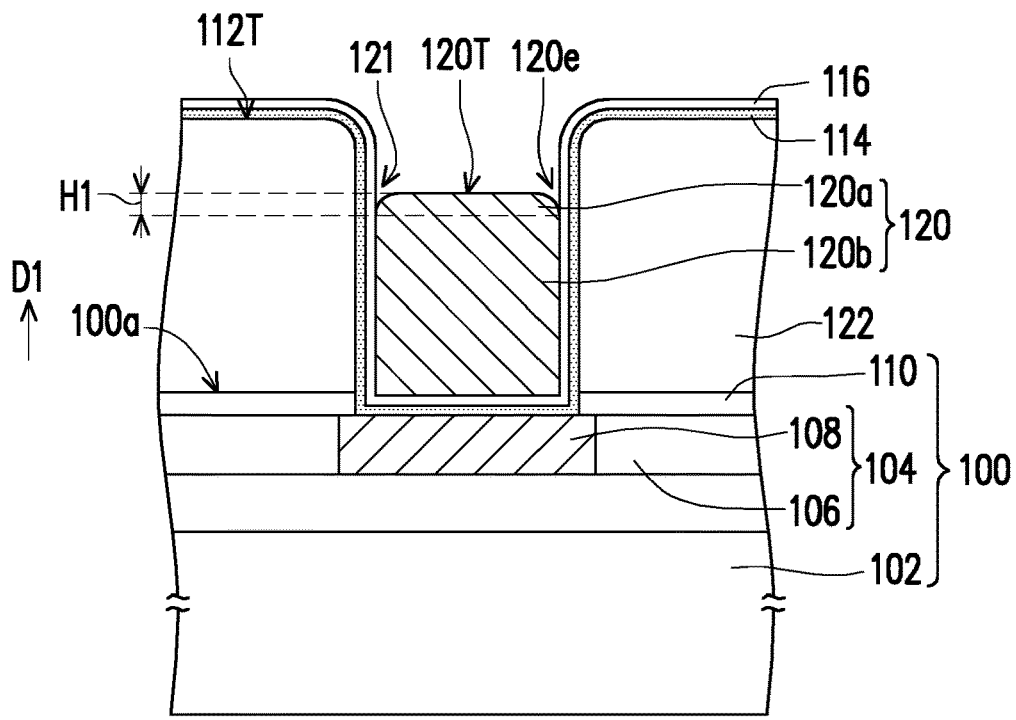

Referring to FIG. 1B and FIG. 1C, a first planarization process is performed on the first conductive material 118 to remove a portion of the first conductive material 118, so as to expose a top surface of the first seed layer 116 over the first bonding dielectric material 112. In some embodiments, the first planarization process includes a chemical mechanical polishing (CMP) process, an etching back process, or a combination thereof. After the first planarization process is performed, a first bonding metal layer 120 is formed in the opening 113. In the case, as shown in FIG. 1C, a top surface 120T of the first bonding metal layer 120 is less than a top surface 112T of the first bonding dielectric material 112.

As shown in FIG. 1C, the first bonding metal layer 120 includes a top portion 120*a* and a bottom portion 120*b* below the top portion 120*a*. An edge 120*e* of the top portion 120*a* of the first bonding metal layer 120 is away from sidewalls of the opening 113 (or the first seed layer 116), so as to form a recess 121 between top portion 120*a* of the first bonding metal layer 120 and the first seed layer 116. Specifically, the top portion 120*a* of the first bonding metal layer 120 has a tapered sidewall. As shown in FIG. 1C, a horizontal cross-sectional area of the top portion 120*a* of the first bonding metal layer 120 gradually decreases in a direction D1 from a bottom portion 120*b* of the first bonding metal layer 120 to the top portion 120*a* of the first bonding metal layer 120. The direction D1 is substantially perpendicular to a surface of the front side 100*a* of the first die 100. That is, a horizontal cross-sectional area of a top surface of the top portion 120*a* is less than a horizontal cross-sectional area of a bottom surface of the top portion 120*a*. In some embodiments, a height difference H1 between a highest point and a lowest point of the top surface 120T of the first bonding metal layer 120 is about 50 Å to 1 KÅ.

On the other hand, as shown in FIG. 1C, a sidewall of the bottom portion 120*b* is adjacent and in contact with the sidewall of the first seed layer 116. That is, no space exists between the bottom portion 120*b* and the first seed layer 116. In some embodiments, the bottom portion 120*b* has a substantially perpendicular sidewall with respect to the front side 100*a* of the first die 100. That is, a horizontal cross-sectional area of a top surface of the bottom portion 120*b* and a horizontal cross-sectional area of a bottom surface of the bottom portion 120*b* are the same. In some other embodiments, the bottom portion 120*b* has a tapered sidewall respect to the front side 100*a* of the first die 100. That is, the horizontal cross-sectional area of a top surface of the bottom portion 120*b* and the horizontal cross-sectional area of a bottom surface of the bottom portion 120*b* are different.

Figure 3:
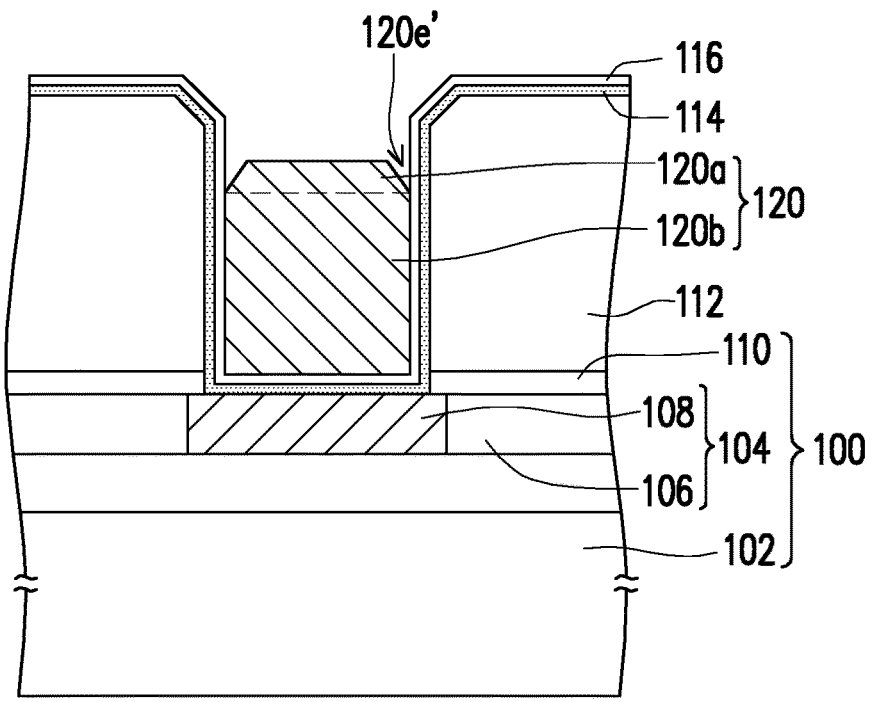
FIG. 3 is a cross-sectional view of a structure of FIG. 1C in accordance with some embodiments.

Further, in some alternative embodiments, a ratio of a height of the top portion 120*a* of the first bonding metal layer 120 to a height of the bottom portion 120*b* of the first bonding metal layer 120 is about 0.0001 to 0.2. Although the edge 120*e* of a top portion 120*a* of the first bonding metal layer 120 is curved or rounding, the embodiments of the present invention are not limited thereto. In other embodiments, as shown in FIG. 3, the edge 120*e*' of a top portion 120*a* of the first bonding metal layer 120 may be straight or planar due to the adjustment of parameters of the first planarization process.

Figure 1D:
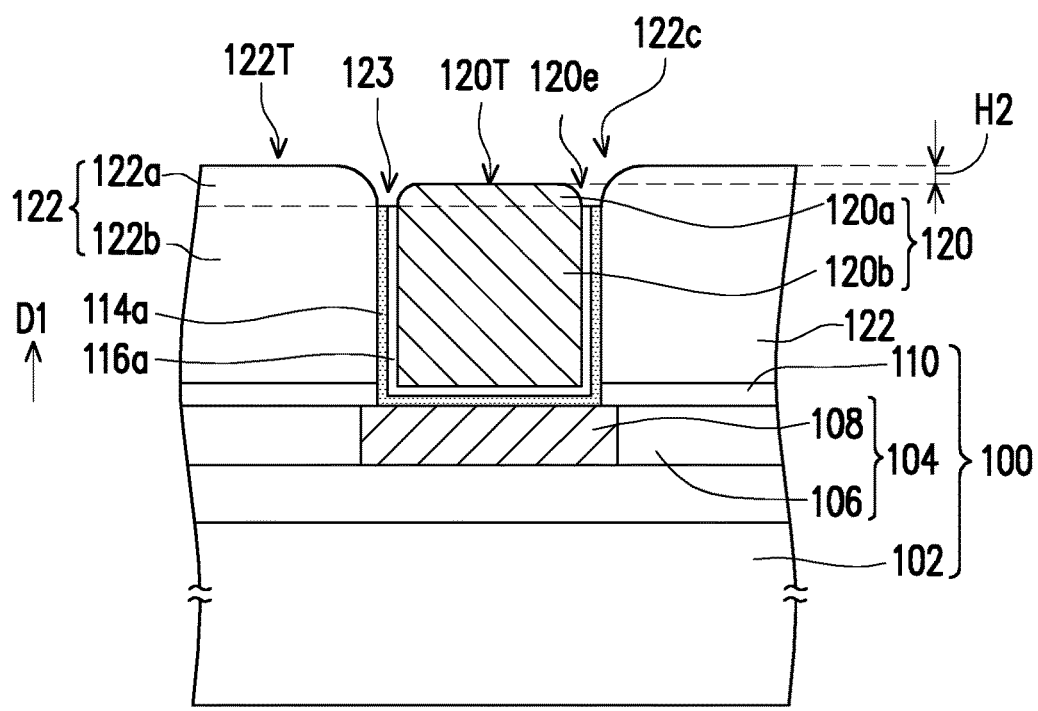

Referring to FIG. 1C and FIG. 1D, a second planarization process is performed to remove a portion of the first seed layer 116, a portion of the first barrier layer 114, and a portion of the first bonding dielectric material 112. In the case, few portions of the first bonding metal layer 120 may be loss during the second planarization process. However, the profile of the first bonding metal layer 120 is not affected. That is, the edge 120*e* of the top portion 120*a* of the first bonding metal layer 120 is still curved or rounding. In some embodiments, the second planarization process includes a chemical mechanical polishing (CMP) process, an etching back process, or a combination thereof. After the second planarization process is performed, the first bonding dielectric material 112 is thinned to form a first bonding dielectric layer 122. In the case, as shown in FIG. 1D, a top surface 122T of the first bonding dielectric layer 122 is higher than or equal to a top surface 120T of the first bonding metal layer 120. In some embodiments, a height difference H2 between the top surface 122T of the first bonding dielectric layer 122 and the top surface 120T of the first bonding metal layer 120 is about 0 Å to 500 Å.

As shown in FIG. 1D, the first bonding dielectric layer 122 includes a top portion 122*a* and a bottom portion 122*b*. A corner 122*c* of the top portion 122*a* of the first bonding dielectric layer 122 is away from the edge 120*e* of a top portion 120*a* of the first bonding metal layer 120, so as to widen the recess 121 to form a recess 123 between the first bonding metal layer 120 and the first bonding dielectric layer 122. That is, the recess 123 is greater than the recess 121. Specifically, the top portion 122*a* of the first bonding dielectric layer 122 has a tapered sidewall. As shown in FIG. 1D, a horizontal cross-sectional area of the top portion 122*a* of the first bonding dielectric layer 122 gradually decreases in the direction D1 from a bottom portion 122*b* of the first bonding dielectric layer 122 to the top portion 122*a* of the first bonding dielectric layer 122. That is, a horizontal cross-sectional area of a top surface of the top portion 122*a* is less than a horizontal cross-sectional area of a bottom surface of the top portion 122*a*. On the other hand, a sidewall of the bottom portion 122*b* is adjacent and in contact with the sidewall of the first barrier layer 114*a*. In some embodiments, the bottom portion 122*b* has a substantially perpendicular sidewall with respect to the top surface of the front side 100*a* of the first die 100. That is, a horizontal cross-sectional area of a top surface of the bottom portion 122*b* and a horizontal cross-sectional area of a bottom surface of the bottom portion 122*b* are the same. In some other embodiments, the bottom portion 122*b* has a tapered sidewall with respect to the top surface of the front side 100*a* of the first die 100. That is, the horizontal cross-sectional area of a top surface of the bottom portion 122*b* and the horizontal cross-sectional area of a bottom surface of the bottom portion 122*b* are different.

Although the corner 122*c* of a top portion 122*a* of the first bonding dielectric layer 122 is curved or rounding, the embodiments of the present invention are not limited thereto. In other embodiments, the edge of a top portion 122*a* of the first bonding dielectric layer 122 may be straight or planar due to the adjustment of parameters of the second planarization process. In some embodiments, the first planarization process and the second planarization process use different slurries, for example. In some embodiments, a removing rate of the first barrier layer 114 is greater than a removing rate of the first bonding dielectric layer 122 during the second planarization process, thus, the first barrier layer 114*a* is lower than the top surface 122T of the first bonding dielectric layer 122.

After the second planarization process is performed, remaining portions of the first barrier layer 114*a* and the first seed layer 116*a* are disposed between the bottom portion 120*a* of the first bonding metal layer 120 and the bottom portion 122*a* of the first bonding dielectric layer 122. The remaining portions of the first barrier layer 114*a* (hereinafter, referred as first barrier layer 114*a*) is able to prevent the first bonding metal layer 120 from diffusing into the first bonding dielectric layer 122. Throughout the description, the remaining portion of the first seed layer 116*a* is referred to as portions of the first bonding metal layer 120. In subsequent drawings, the remaining portion of the first seed layer 116*a* is considered as the portions of the first bonding metal layer 120, and are not shown separately.

Although the first barrier layer 114*a* illustrated in FIG. 1D is lower than the top surface 122T of the first bonding dielectric layer 122, the embodiments of the present invention are not limited thereto. In some alternative embodiments, the first barrier layer 114a may be equal to or higher than the top surface 122T of the first bonding dielectric layer 122.

Figure 1E:
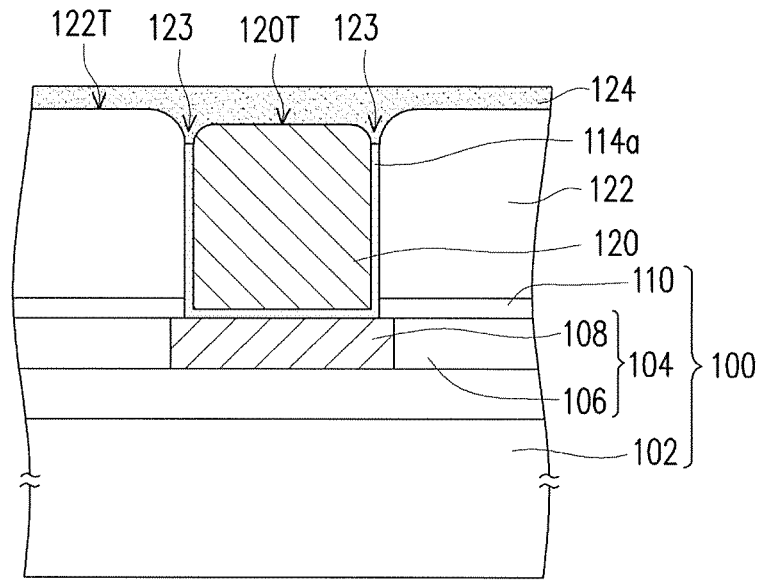

Referring to FIG. 1E, a first protection material 124 is formed over the first bonding metal layer 120 and the first bonding dielectric layer 122. In detail, the first protection material 124 is filled in the recess 123 and covers the top surface 120T of the first bonding metal layer 120 and the top surface 122T of the first bonding dielectric layer 122. In some embodiments, the first protection material 124 includes silicon nitride, silicon oxynitride, silicon carbide, nitrogen-doped silicon carbide, oxygen-doped silicon carbide or a combination thereof and is formed by a suitable deposition process, such as PECVD, HDPCVD, etc. In some embodiments, the first protection material 124 is an insulating material, which may be a single layer or a composite layer including a plurality of sub-layers formed of different insulating materials. In some alternative embodiments, the first protection material 124 and the first bonding dielectric layer 122 have different materials. In other embodiments, an oxygen content of the first protection material 124 is less than an oxygen content of the first bonding dielectric layer 122.

Referring to FIG. 1E and FIG. 1F, a third planarization process is performed on the first protection material 124 to remover a portion of the first protection material 124, so as to expose the top surface 120T of the first bonding metal layer 120. In some embodiments, the third planarization process includes a chemical mechanical polishing (CMP) process, an etching back process, or a combination thereof. After the third planarization process is performed, a first protection structure 126 is formed in the recess 123 and disposed between the top portion 120a of the first bonding metal layer 120 and the top portion 122a of the first bonding dielectric layer 122. In the case, a top surface 126T of the first protection structure 126, the top surface 120T of the first bonding metal layer 120, and the top surface 122T of the first bonding dielectric layer 122 are substantially coplanar.

It should be noted that the first protection structure 126 has a tapered profile. As shown in FIG. 1F, a horizontal cross-sectional area of the first protection structure 126 gradually decreases in a direction D2 from a top portion of the first protection structure 126 to a bottom portion of the first protection structure 126. The direction D2 is substantially perpendicular to the surface of the front side 100a of the first die 100. A first tapered sidewall S1 of the first protection structure 126 is adjacent and corresponds to the top portion 120a of the first bonding metal layer 120, while a second tapered sidewall S2 of the first protection structure 126 is adjacent and corresponds to the top portion 122a of the first bonding dielectric layer 122. The first tapered sidewall S1 and the second tapered sidewall S2 are respectively bent toward opposite directions. As shown in FIG. 1F, a bottom of the first protection structure 126 is in contact with a top of the first barrier layer 114a. In addition, the first barrier layer 114a does not extend into the first protection structure 126. That is, no any first barrier layer 114a exists in the first protection structure 126. Although the sidewalls S1 and S2 of the first protection structure 126 are curved or rounding, the embodiments of the present invention are not limited thereto. In other embodiments, the sidewalls of the first protection structure 126 may be straight or planar. In some cases, the sidewalls of the first protection structure 126 are symmetric or asymmetric. In alternative cases, different sidewalls of the first protection structure 126 may have different shapes.

FIG. 4A to FIG. 4D are cross-sectional views of a structure of FIG. 1F in accordance with various embodiments. FIG. 5A to FIG. 5C are top views of a structure of FIG. 1F in accordance with various embodiments.

In some embodiments, the first protection structure 126a may be, but not limited, a closed ring surrounding the first bonding metal layer 120, as shown in FIG. 5A. In the case, the first bonding metal layer 120 is referred as a metal pillar. In another embodiment, the first protection structure 126b may be, but not limited, strips disposed aside sidewalls of the first bonding metal layer 120, as shown in FIG. 5B. In the case, the first bonding metal layer 120 is referred as a metal strip.

Figure 4A:
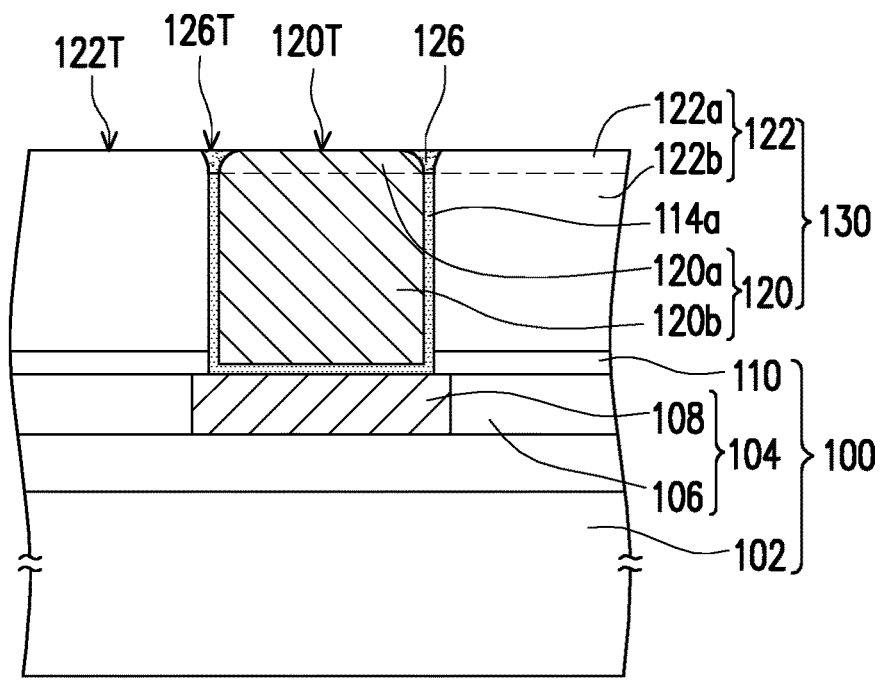
FIG. 4A to FIG. 4D are cross-sectional views of a structure of FIG. 1F in accordance with various embodiments.
Figure 4B:
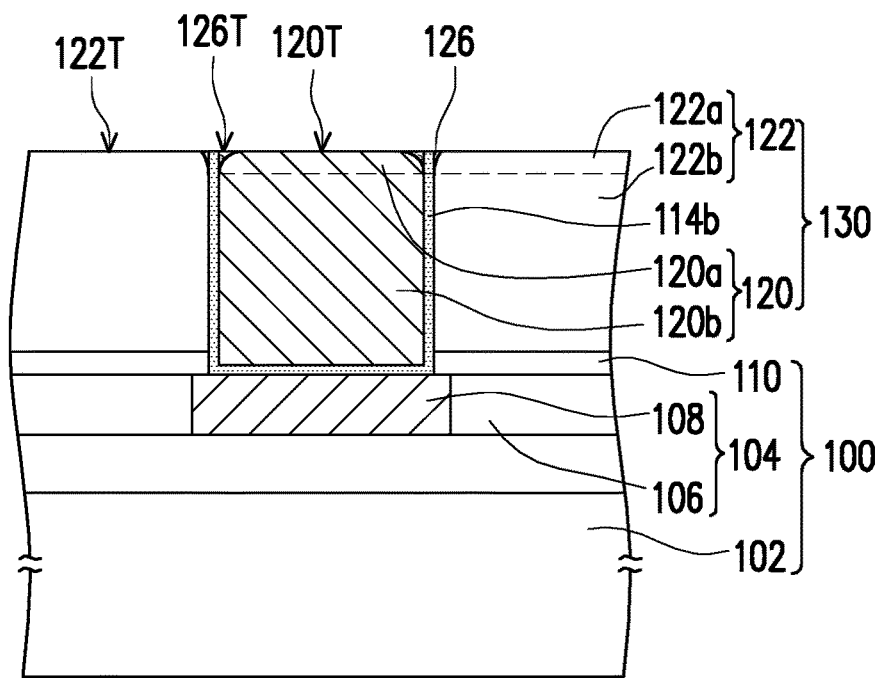
Figure 4D:
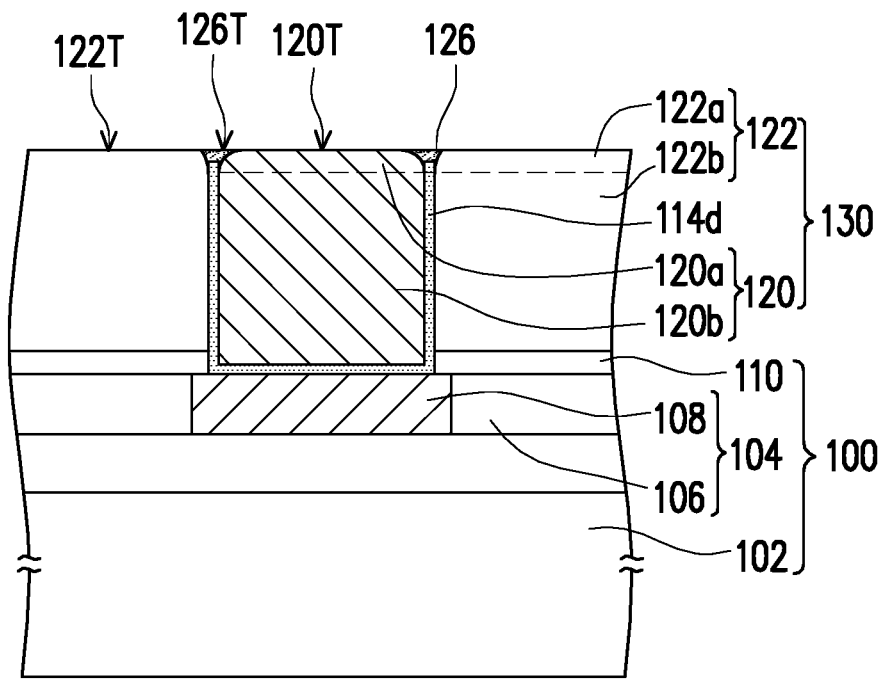
Figure 5A:
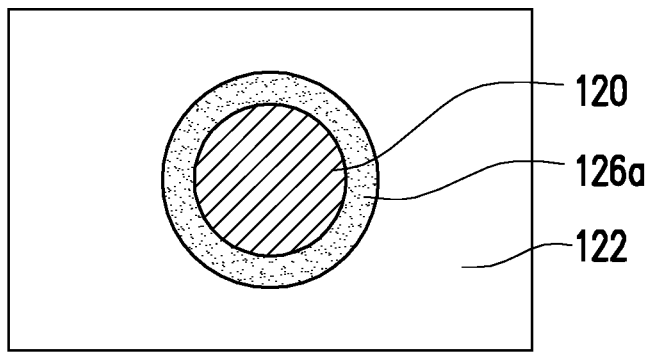
FIG. 5A to FIG. 5C are top views of a structure of FIG. 1F in accordance with various embodiments.
Figure 5B:
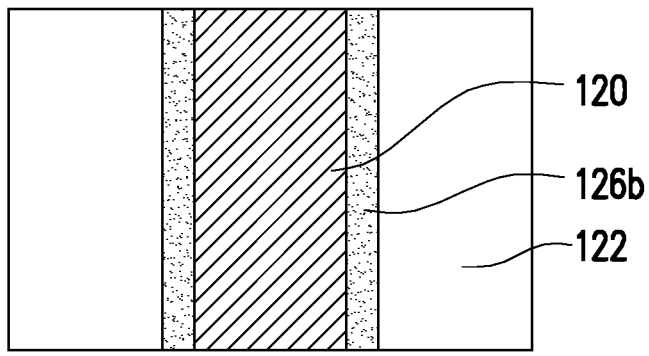
Figure 5C:
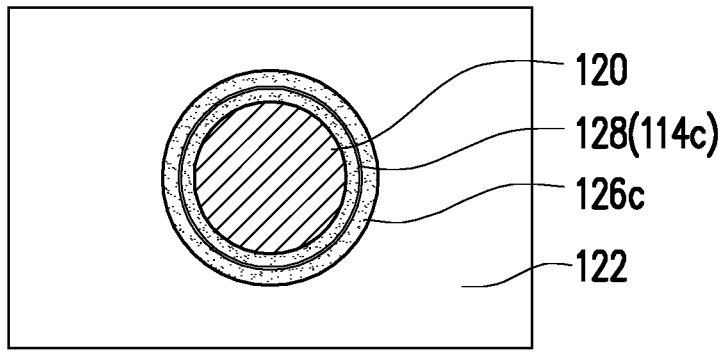

Although the first barrier layer 114a illustrated in FIG. 1F and FIG. 4A is only disposed between the bottom portion 120b of the first bonding metal layer 120 and the bottom portion 122b of the first bonding dielectric layer 122, the embodiments of the present invention are not limited thereto. In alternative embodiments, the first barrier layer 114b may extend into the first protection structure 126. In the case, a top surface of the first barrier layer 114b may be coplanar with the top surface 126T of the first protection structure 126, as shown in FIG. 4B. In other case, the top surface of the first barrier layer 114d may be less than the top surface 126T of the first protection structure 126, while the first protection structure 126 covers the top surface of the first barrier layer 114d, as shown in FIG. 4D.

Figure 4C:
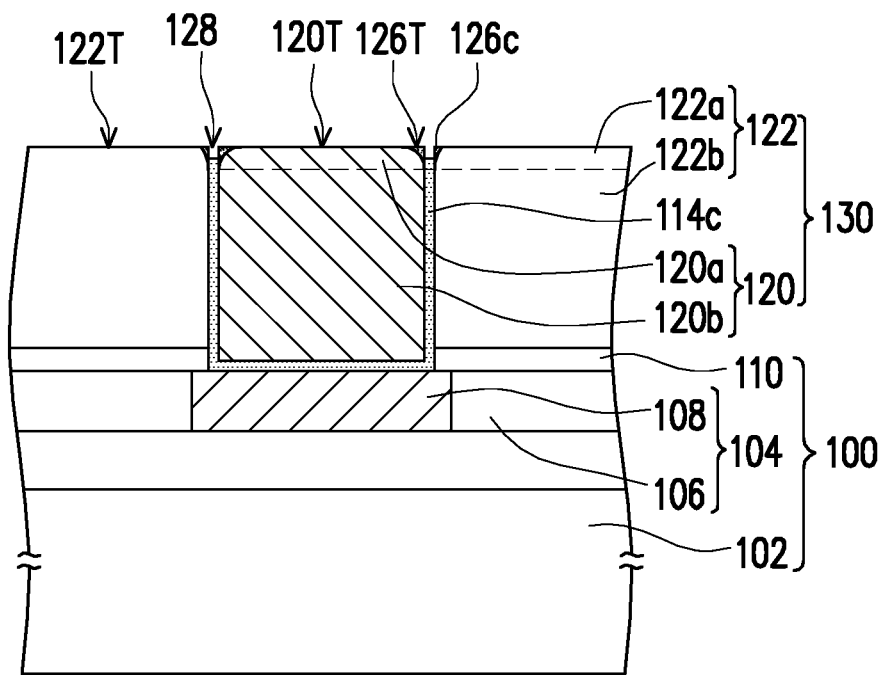

Alternatively, the top surface of the first barrier layer 114c may be less than the top surface 126T of the first protection structure 126c to form a dimple 128 in the first protection structure 126c, as shown in FIG. 4C. From another perspective, as shown in FIG. 5C, when the first bonding metal layer 120 is the metal pillar, the first protection structure 126c surrounds the first bonding metal layer 120, the dimple 128 in the first protection structure 126c is surrounds the first bonding metal layer 120 as well. The dimple 128 is formed due to a removing rate of the first barrier layer 114c is greater than a removing rate of the first protection structure 126c during the third planarization process.

Referring back to FIG. 1F, a first die structure 100 is accomplished after the third planarization process is performed. In detail, the first die structure 100 includes the first die 100, a first bonding structure 130, and the first protection structure 126. The first bonding structure 130 is disposed over the front side 100a of the first die 100. The first bonding structure 130 includes the first bonding dielectric layer 122 and the first bonding metal layer 120 disposed in the first bonding dielectric layer 122. The first protection structure 126 is disposed between the top portion 120a of the first bonding metal layer 120 and the top portion 122a of the first bonding dielectric layer 122.

Figure 1G:
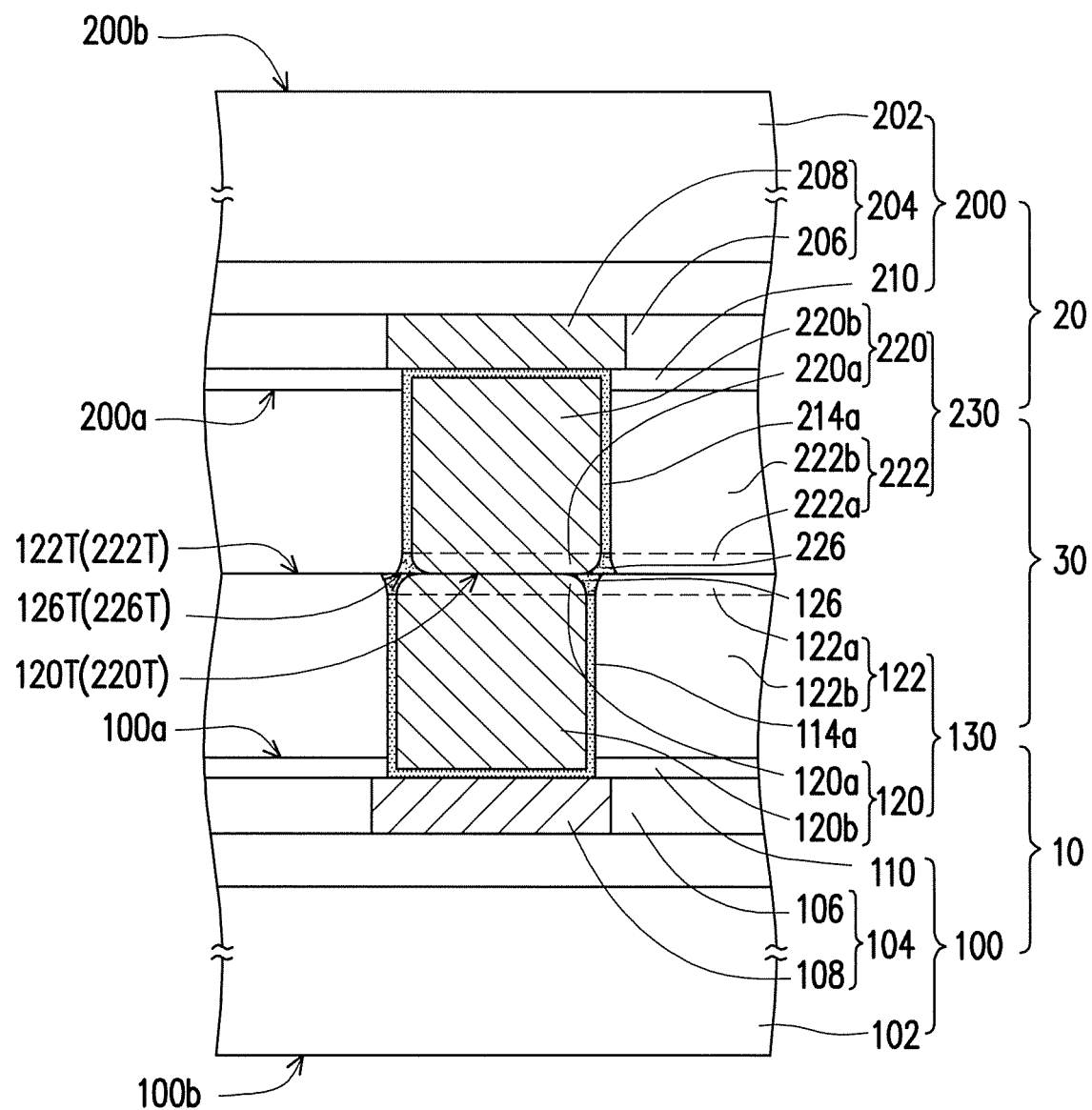

Referring to FIG. 1F and FIG. 1G, a second die structure 20 is provided. In some embodiments, the second die structure 20 includes a second die 200, a second bonding structure 230, and a second protection structure 226. The second die 200 includes a front side 200a and a back side 200b opposite to each other. The front side 200a of the first die 100 faces downward. In detail, the second die 200 includes a second substrate 202, a second interconnect structure 204, and a second passivation layer 210. The second interconnect structure 204 is formed over the second substrate 202. The second interconnect structure 204 includes a second insulating material 206 and a second metal feature 208 disposed in the second insulating material 206. The second passivation layer 210 is formed over the second interconnect structure 204 to cover the second insulating material 206 and a portion of the second metal feature 208.

The second bonding structure 230 is disposed over the front side 200a of the second die 200. The second bonding structure 230 includes the second bonding dielectric layer 222 and the second bonding metal layer 220 disposed in the second bonding dielectric layer 222. The second bonding structure 230 further includes a second barrier layer 214a disposed between the bottom portion 220b of the second bonding metal layer 220 and the bottom portion 222b of the second bonding dielectric layer 222. The second protection structure 226 is disposed between the top portion 220a of the second bonding metal layer 220 and the top portion 222a of the second bonding dielectric layer 222. The arrangement, material and forming method of the second die structure 20 are similar to the arrangement, material and forming method of the first die structure 10. Thus, details thereof are omitted here.

In some embodiments, the first die 100 and the second die 200 may have the same function or different functions. In some embodiments, one of the first die 100 and the second die 200 includes an application-specific integrated circuit (ASIC) chip, an analog chip, a sensor chip, a wireless such as Bluetooth, and radio frequency chip, a voltage regulator chip or a memory chips such as dynamic random access memory (DRAM) chip or static random access memory (SRAM) chip.

Referring to FIG. 1G, the second die structure 20 is flipped, so that the front side 200a of the second die 200 faces toward the front side 100a of the first die 100. The first die structure 10 and the second die structure 20 are bonded together via the first bonding structure 130 and the second bonding structure 230 to form a die stack structure 1. That is, the first bonding structure 130 and the second bonding structure 230 are hybrid bonded together by a hybrid bonding to form a hybrid bonding structure 30. The first bonding structure 130 and the second bonding structure 230 are hybrid bonded together by the application of pressure and heat. In some embodiments, a process temperature of the hybrid bonding process is about 100° C. to 900° C., while the process pressure of the hybrid bonding process is 0.01 Mpa to 10 Mpa, although alternatively, other amounts of process temperature and process pressure may be used for the hybrid bonding process.

In some embodiments, the hybrid bonding involves at least two types of bonding, including metal-to-metal bonding and non-metal-to-non-metal bonding such as dielectric-to-dielectric bonding or fusion bonding. As shown in FIG. 1G, the hybrid bonding structure 30 includes the first bonding metal layer 120 and the second bonding metal layer 220 bonded by metal-to-metal bonding to form a bonding metal stack and the first bonding dielectric layer 122 and the second bonding dielectric layer 222 bonded by non-metal-to-non-metal bonding to form a bonding dielectric stack. The bonding metal stack is formed in the bonding dielectric stack. In addition, the hybrid bonding structure 30 further includes the first protection structure 126 and the second protection structure 226 connected to each other, so as to a protection structure. The protection structure disposed between the bonding dielectric stack and the bonding metal stack. In some embodiments, the protection structure is disposed a middle portions of the bonding dielectric stack and the bonding metal stack. In an embodiment, the first protection structure 126 and the second protection structure 226 may be aligned and connected to each other, so as to form a blocking wall. In some embodiments, the blocking wall may include a slit or not include any slit between the first protection structure 126 and the second protection structure 226.

It should be noted that the first protection structure 126 and/or the second protection structure 226 is able to avoid the metal out diffusion, so as to enhance the reliability of the die stack structure 1. Specifically, an anti-diffusion property of the first protection structure 126 and/or the second protection structure 226 is greater than an anti-diffusion property of the first bonding dielectric layer 122 and/or the second bonding dielectric layer 222. As shown in FIG. 1G, when the first die structure 10 and the second die structure 20 are misaligned, the first bonding metal layer 120 and the second bonding dielectric layer 222 are isolated from each other by the first protection structure 126 and the second protection structure 226. Therefore, the first protection structure 126 and the second protection structure 226 is able to prevent the first bonding metal layer 120, such as Cu, from diffusing into the second bonding dielectric layer 222. Similarly, the second bonding metal layer 220 and the first bonding dielectric layer 122 are isolated from each other by the first protection structure 126 and the second protection structure 226, so as to prevent the second bonding metal layer 220, such as Cu, from diffusing into the first bonding dielectric layer 122. As a result, the metal out diffusion is avoided, so that the reliability of the die stack structure 1 is enhanced.

In addition, the first protection structure 126 and/or the second protection structure 226 is able to increase the alignment window for bonding the first die structure 10 and the second die structure 20. In detail, since the first protection structure 126 and/or the second protection structure 226 are disposed between the first bonding metal layer 120 and/or second bonding metal layer 220 and the first bonding dielectric layer 122 and/or second bonding dielectric layer 222, the metal out diffusion is still prevented when the misalignment of the first die structure 10 and the second die structure 20 is occurred. Thus, the bonding yield of the die stack structure 1 is getting better due to increase the alignment window.

In addition, the top surface 126T of the first protection structure 126, the top surface 120T of the first bonding metal layer 120, and the top surface 122T of the first bonding dielectric layer 122 are substantially coplanar, while a top surface 226T of the second protection structure 226, a top surface 220T of the second bonding metal layer 220, and a top surface 222T of the second bonding dielectric layer 222 are substantially coplanar. Therefore, the first bonding structure 130 and the second bonding structure 230 can be bonded together tightly without any protrusion and/or void between the first bonding structure 130 and the second bonding structure 230. That is, the bonding strength between the first bonding structure 130 and the second bonding structure 230 is improved, so as to achieve the better bonding yield.

In some embodiments, an oxygen content of the first bonding dielectric layer 122 and/or the second bonding dielectric layer 222 is greater than an oxygen content of the first protection structure 126 and/or the second protection structure 226. Compared with the first protection structure 126 and/or the second protection structure 226, the first bonding dielectric layer 122 and the second bonding dielectric layer 222 are more ease to be bonded together. For example, when the first bonding dielectric layer 122 and/or the second bonding dielectric layer 222 includes SiON, the first protection structure 126 and/or the second protection structure 226 includes SiN. In alternative embodiments, the first bonding dielectric layer 122 and/or the second bonding dielectric layer 222 and the first protection structure 126 and/or the second protection structure 226 include the same material or different materials.

In some embodiments, the first die structure 10 and the second die structure 20 illustrated in FIG. 1G are bonded in a face-to-face bonding, however, the embodiments of the present invention are not limited thereto. In alternative embodiments, the first die structure 10 and the second die structure 20 are bonded in a face-to-back bonding or a back-to-back bonding.

Furthermore, the die stack structure 1 may be encapsulated by an encapsulatant to form a package (not shown). In some embodiments, one or more redistribution layers is further formed over one side or two side of the package to form an integrated fan-out package. In alternative embodiments, the integrated fan-out package may be stacked over and electrically connected to another package, such as a memory device, to form a package-on-package (POP) structure.

According to some embodiments, a die structure includes a die, a bonding structure, and a protection structure. The die includes a substrate and a metal feature disposed over the substrate. The bonding structure is disposed over the die. The bonding structure includes a bonding dielectric layer and a bonding metal layer disposed in the bonding dielectric layer. The bonding metal layer is electrically connected to the metal feature of the die. The protection structure is disposed between a top portion of the bonding metal layer and a top portion of the bonding dielectric layer.

According to some embodiments, a die stack structure includes a first die and a second die hybrid bonded together by a hybrid bonding structure. The hybrid bonding structure includes a bonding dielectric stack, a bonding metal stack, and a protection structure. The bonding dielectric stack is connected to the first die and the second die. The bonding metal stack is disposed in the bonding dielectric stack. The protection structure is disposed between the bonding dielectric stack and the bonding metal stack.

According to some embodiments, a method of fabricating a die structure includes providing a die, the die comprising a substrate and a metal feature disposed over the substrate; forming a bonding structure over the die, wherein the bonding structure comprises a bonding dielectric layer and a bonding metal layer disposed in the bonding dielectric layer, and a recess is formed between a top portion of the bonding metal layer and a top portion of the bonding dielectric layer; and forming a protection structure in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stack structure, comprising:
   a first die and a second die hybrid bonded together by a hybrid bonding structure, wherein the hybrid bonding structure comprises:
   a first bonding structure disposed over the first die and comprising a first bonding dielectric layer, a first bonding metal layer disposed in the first bonding dielectric layer, and a first barrier layer covering a surface of a lower portion of the first bonding metal layer;
   a second bonding structure disposed over the second die and comprising a second bonding dielectric layer, a second bonding metal layer disposed in the second bonding dielectric layer, and a second barrier layer covering a surface of a lower portion of the second bonding metal layer;
   a first protection structure sandwiched between the first bonding metal layer, the first bonding dielectric layer, and the first barrier layer; and
   a second protection structure sandwiched between the second bonding metal layer, the second bonding dielectric layer, and the second barrier layer,
   wherein the first protection structure is in contact with the second protection structure, a material of the first and second protection structures comprises an insulating material, one of the first and second protection structures has tapered sidewalls facing to each other, and the tapered sidewalls are respectively bent toward opposite directions.

2. The die stack structure of claim 1, wherein the hybrid bonding structure comprises:
   the first protection structure is only disposed between a top portion of the first bonding metal layer and a top portion of the first bonding dielectric layer,
   the second protection structure is only disposed between a top portion of the second bonding metal layer and a top portion of the second bonding dielectric layer.

3. The die stack structure of claim 2, wherein the first protection structure is partially overlapped with the second protection structure.

4. The die stack structure of claim 1, wherein the first barrier layer extends into the first protection structure, and an upper portion of the first barrier layer is laterally surrounded by the first protection structure.

5. The die stack structure of claim 4, wherein a top surface of the first barrier layer is lower than a top surface of the first protection structure to form a dimple on the first barrier layer, and the dimple is laterally surrounded by the first protection structure.

6. The die stack structure of claim 4, wherein a top surface of the first barrier layer is lower than a top surface of the first protection structure and the first protection structure covers the top surface of the first barrier layer.

7. The die stack structure of claim 4, wherein a top surface of the first barrier layer is substantially coplanar with a top surface of the first protection structure.

8. The die stack structure of claim 2, wherein the first protection structure surrounds the top portion of the first bonding metal layer, and the second protection structure surrounds the top portion of the second bonding metal layer.

9. A die stack structure, comprising:
   two dies bonded to each other by a hybrid bonding structure comprising two bonding structures being in contact with each other, wherein each bonding structure comprises:
   a bonding dielectric layer;
   a bonding metal layer disposed in the bonding dielectric layer;
   a barrier layer covering a surface of a lower portion of the bonding metal layer; and
   a protection structure disposed on the barrier layer and sandwiched between a top portion of the bonding metal layer and a top portion of the bonding dielectric layer, wherein the protection structure comprises an insulating material,
wherein the protection structure has a first tapered sidewall and a second tapered sidewall facing to each other, and the first and second tapered sidewalls are respectively bent toward opposite directions and in contact with the bonding metal layer and the bonding dielectric layer.

10. The die stack structure of claim 9, wherein the protection structures of the two bonding structures are offset from each other and in contact with each other.

11. The die stack structure of claim 9, wherein a top surface of the protection structure, a top surface of the bonding metal layer, and a top surface of the bonding dielectric layer are substantially coplanar.

12. The die stack structure of claim 9, wherein a horizontal cross-sectional area of the protection structure gradually decreases in a direction from a top of the protection structure to a bottom of the protection structure.

13. The die stack structure of claim 9, wherein the first and second tapered sidewalls of the protection structure are straight or curved.

14. The die stack structure of claim 9, wherein the protection structure surrounds the top portion of the bonding metal layer.

15. The die stack structure of claim 9, wherein the insulating material of the protection structure comprises silicon nitride, silicon oxynitride, silicon carbide, nitrogen-doped silicon carbide, oxygen-doped silicon carbide or a combination thereof.

16. The die stack structure of claim 9, wherein an anti-diffusion property of the protection structure is greater than an anti-diffusion property of the bonding dielectric layer.

17. The die stack structure of claim 9, wherein an oxygen content of the bonding dielectric layer is greater than an oxygen content of the protection structure.

18. A method of fabricating a die stack structure, comprising:
providing a first die structure, comprising:
forming a first bonding structure over a first die, wherein the first bonding structure comprises a first bonding dielectric layer, a first bonding metal layer disposed in the first bonding dielectric layer, a first barrier layer covering a surface of a lower portion of the first bonding metal layer, and a first protection structure sandwiched between the first bonding metal layer, the first bonding dielectric layer, and the first barrier layer;
providing a second die structure, comprising:
forming a second bonding structure over a second die, wherein the second bonding structure comprises a second bonding dielectric layer, a second bonding metal layer disposed in the second bonding dielectric layer, a second barrier layer covering a surface of a lower portion of the second bonding metal layer, and a second protection structure sandwiched between the second bonding metal layer, the second bonding dielectric layer, and the second barrier layer;
bonding the first and second die structures by a hybrid bonding structure comprising the first and second bonding structures being in contact with each other, wherein the first protection structure is in contact with the second protection structure, the first and second protection structures comprises an insulating material, one of the first and second protection structures has tapered sidewalls facing to each other, and the tapered sidewalls are respectively bent toward opposite directions.

19. The method of claim 18, wherein the forming the first bonding structure over the first die comprises:
forming a bonding dielectric material over the first die;
patterning the bonding dielectric material to form an opening in the bonding dielectric material;
forming a conductive material to fill in the opening, and to cover a top surface of the bonding dielectric material;
performing a first planarization process to remove a portion of the conductive material, so as to form the first bonding metal layer in the opening, wherein an edge of a top portion of the first bonding metal layer is away from sidewalls of the opening; and
performing a second planarization process to remover a portion of the bonding dielectric material, so as to form the first bonding dielectric layer, wherein an edge of a top portion of the first bonding dielectric layer is away from the top portion of the first bonding metal layer, thereby forming a recess between the top portion of the first bonding metal layer and the top portion of the first bonding dielectric layer.

20. The method of claim 19, wherein the forming the first bonding structure over the first die further comprises:
forming a protection material to fill in the recess; and
performing a third planarization process to remover a portion of the protection material, so as to form the first protection structure, wherein a top surface of the first protection stricture is substantially coplanar with a top surface of the first bonding metal layer and a top surface of the first bonding dielectric layer after the third planarization process.

* * * * *